United States Patent
Trosa et al.

(10) Patent No.: US 6,894,550 B2
(45) Date of Patent: May 17, 2005

(54) PHASE SHIFTER CONTROL VOLTAGE DISTRIBUTION IN A PHASED ARRAY UTILIZING VOLTAGE-PROPORTIONAL PHASE SHIFT DEVICES

(75) Inventors: Ralph Trosa, Indialantic, FL (US); Robert W. Perry, Indialantic, FL (US); Neville Glyn Maycock, Jr., Palm Bay, FL (US); Joseph A. Elam, Palm Bay, FL (US); Stanley R. Wessel, Jupiter, FL (US)

(73) Assignee: Harris Corporation, Melbourne, FL (US)

( * ) Notice: Subject to any disclaimer, the term of this patent is extended or adjusted under 35 U.S.C. 154(b) by 1 day.

(21) Appl. No.: 10/679,608

(22) Filed: Oct. 6, 2003

(65) Prior Publication Data

US 2005/0073347 A1 Apr. 7, 2005

(51) Int. Cl.[7] .............................................. H03H 11/16
(52) U.S. Cl. ..................................... 327/234; 327/258
(58) Field of Search .................................. 327/231–234, 327/237–239, 258; 333/164; 361/139, 152; 342/361, 371–377

(56) References Cited

U.S. PATENT DOCUMENTS

| | | | | | |
|---|---|---|---|---|---|
| 3,238,528 | A | * | 3/1966 | Hines | 342/372 |
| 3,596,145 | A | * | 7/1971 | Sheldon et al. | 361/152 |
| 3,754,274 | A | * | 8/1973 | Auger | 342/377 |
| 4,686,533 | A | * | 8/1987 | MacDonald et al. | 342/373 |
| 6,806,792 | B2 | * | 10/2004 | Penn | 333/164 |

* cited by examiner

Primary Examiner—Minh Nguyen
(74) Attorney, Agent, or Firm—Allen, Dyer, Doppelt, Milbrath & Gilchrist, P.A.

(57) ABSTRACT

A phase shift control voltage distribution scheme for a phased array utilizes analog voltage-proportional phase shift devices, to which respective input signals are supplied and from which phase-shifted output signals are produced. A voltage supply unit has a plurality of voltage outputs supplying respectively different analog voltages. A switch network coupled between voltage outputs of the multiple voltage supply unit and the voltage control inputs of the plurality of voltage-controlled phase shift elements, is operative to selectively couple any of the different voltages supplied by the multiple voltage supply unit to the voltage control inputs of any of the voltage-controlled phase shift elements.

20 Claims, 2 Drawing Sheets

PHASE SHIFTER CONTROL VOLTAGE DISTRIBUTION IN A PHASED ARRAY UTILIZING VOLTAGE-PROPORTIONAL PHASE SHIFT DEVICES

FIELD OF THE INVENTION

The present invention relates in general to communication systems and subsystems therefor, and is particularly directed to a new and improved phased array architecture, that is comprised of an array of analog voltage-proportional phase shift elements and a control voltage switching network therefor. The control voltage switching network is operative to selectively couple any of respectively different voltages supplied by a multiple voltage supply unit to voltage control inputs of any of the plurality of voltage-controlled phase shift elements of the phased array architecture, thereby producing whatever phase shift pattern is desired.

BACKGROUND OF THE INVENTION

In the course of development of communication systems and networks that operate at ever increasing frequencies (e.g., on the order of 1–50 GHz and above), the electronics industry continues to look for ways to decrease the cost of components of which such systems and networks are comprised. Because beam steerable and agile systems customarily employ phase shift components, their feed and control interconnect architecture layouts can be quite complex and costly to deploy. Thus, there is currently a need for low cost and reduced complexity phase shift architectures that are capable of operating and relatively high frequencies.

SUMMARY OF THE INVENTION

In accordance with the present invention advantage is taken of analog voltage-proportional phase shift components to implement a low cost analog phased array architecture, that is configured to selectively drive any phase shift element of the array with any one of a plurality of prescribed phase shift-control voltages, so as to enable the phased array to realize a readily easily programmable phase shift pattern therethrough.

To this end the invention is configured of a spatially distributed array of voltage-controlled analog phase shift elements, such as tunable varactor components, dielectric elements or para-electric components, such as ferro-electric devices. Each phase shift element has an RF input port to which a respective input signal is supplied, and an RF output port from which a phase-shifted output signal is obtained. The phase of the output signal is shifted in phase relative to the input signal, in accordance with a control voltage supplied to the voltage control port thereof.

Control voltages for defining the phase shift through each phase shift element are derived from a multiple analog voltage supply unit, configured as a resistor ladder network installed between respective first and second reference voltage terminals, and having a plurality of voltage output ports from which respectively different phase shift control voltages are available. The voltage reference terminals provide a voltage differential that is sufficient to produce the desired amount of phase shift through one of the voltage-controlled phase shift elements. Typically the total voltage range of the resistor ladder network would result in a minimum 360° of phase shift. Individual output ports of the voltage supply unit provide fractional amounts of the total range of phase shift, so that the phase shift resolution for a respective phase shift element is defined by the number N of resistors of the resistor ladder network.

A two-dimensional interconnect or crosspoint switch network is coupled between each of the voltage outputs of the multiple voltage supply unit and voltage control inputs of the plurality of voltage-controlled phase shift elements. The interconnect switch network is controllably operative to (commanded to) selectively couple any of the different voltages supplied by the multiple voltage supply unit to the voltage control input of any of the plurality of voltage-controlled phase shift elements.

The number of rows of the interconnect switch network is defined in accordance with the resolution of the output voltage that is selectively (applied) to any given phase shift element. Column links of the interconnect switch network are coupled to the control voltage ports of the respective phase shift elements. Each switch element may be closed via a control link from a supervisory controller, such as an FPGA, to create the phase shift pattern desired.

The invention allows the use of both linear and non-linear phase shift elements. In the former case, the resistor ladder network is configured of equal valued resistors that provide equal amounts of control voltage at the voltage output ports from which respectively different phase shift control voltages are obtained. In the latter case, the resistor values of the resistor ladder network may be scaled to produce non-linear voltages that will produce the desired linear effect at the output of each phase shifter.

DETAILED DESCRIPTION

Figure 1:
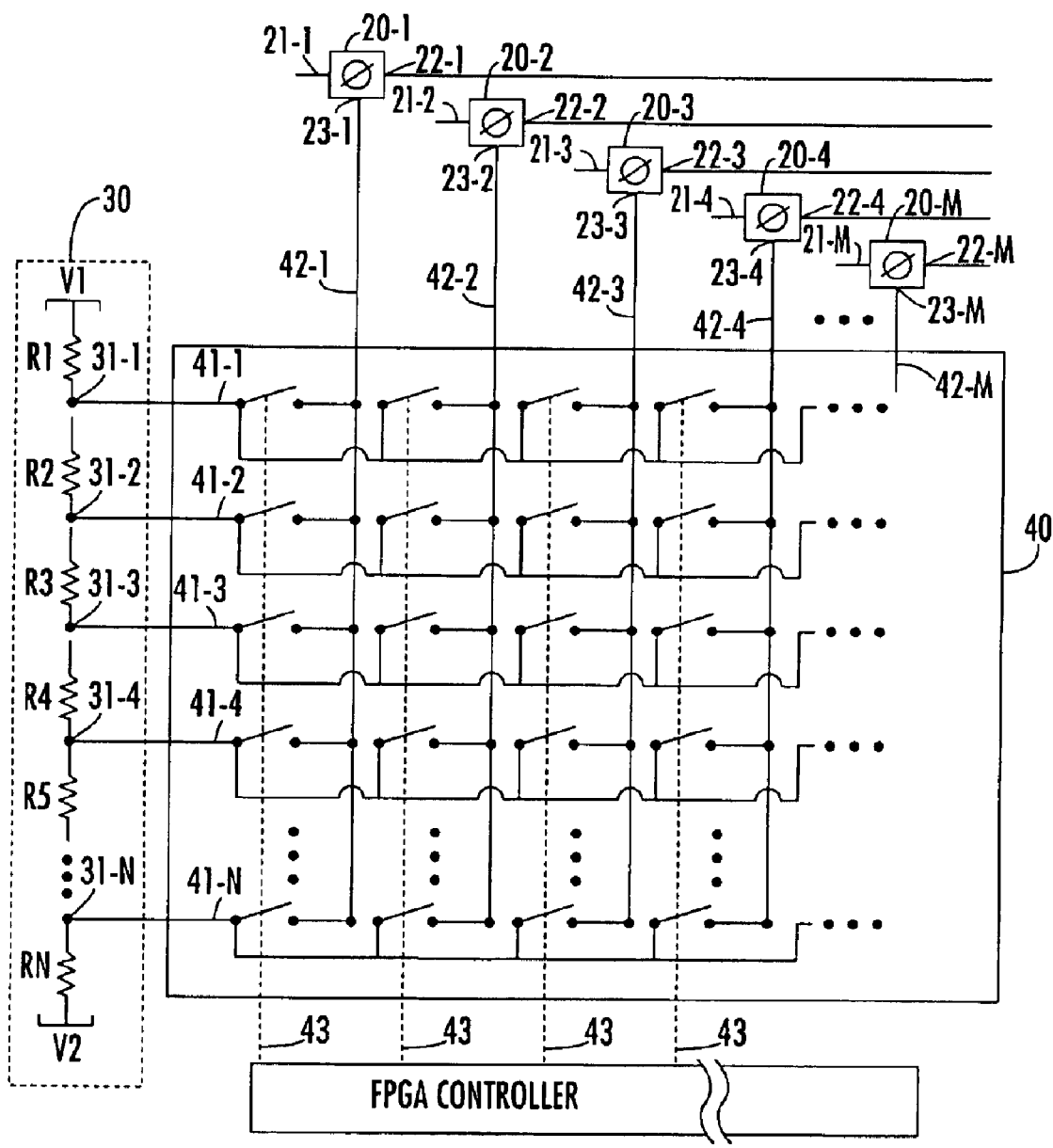
FIG. 1 diagrammatically illustrates an embodiment of an analog voltage-based phase array architecture according to the present invention.

Before describing in detail the phased array architecture of the present invention, it should be observed that the invention resides primarily in a modular arrangement of conventional communication circuits and components and an attendant supervisory controller therefor, that controls the operations of such circuits and components. In a practical implementation that facilitates their being packaged in a hardware-efficient equipment configuration, this modular arrangement may be implemented by means of analog voltage-proportional phase shift elements and an associated application specific integrated circuit (ASIC) chip set.

Consequently, the architecture of such arrangement of circuits and components has been illustrated in the drawings by a readily understandable block diagram, which shows only those specific details that are pertinent to the present invention, so as not to obscure the disclosure with details which will be readily apparent to those skilled in the art having the benefit of the description herein. Thus, the block diagram illustration is primarily intended to show the major components of the invention in a convenient functional grouping, whereby the present invention may be more readily understood.

Attention is now directed to FIG. 1, wherein an embodiment of an analog voltage-based phase shift array according to the present invention is diagrammatically illustrated as comprising a spatially distributed array 10 of voltage-controlled analog phase shift elements 20-1, 20-2, 20-3,

20-4, ..., 20-M, which may be configured utilizing any of the elements referenced above, as a non-limiting example. Each ith phase shift element has an RF input port 21-$i$, to which a respective input signal is supplied and an RF output port 22-$i$ from which a phase-shifted output signal, that is shifted in phase relative to the input signal, in accordance with a control voltage supplied to a control voltage input 23-$i$ thereof.

Control voltages used to controllably define the phase shift through each phase shift element are derived from a multiple voltage supply unit, shown as being configured as a resistor ladder network 30, which is installed between respective first and second reference voltage terminals (V1 and V2) and having a plurality of voltage output ports 31-1, 31-2, 31-3, 31-4, ..., 31-N, from which respectively different phase shift control voltages are derived. The first and second voltage reference terminals V1 and V2 provide a voltage differential sufficient to produce that maximum amount of phase shift through each respective voltage-controlled phase shift element. Typically the total voltage range of the resistor ladder network would cover 360° of phase shift. The individual output ports of the voltage supply unit 30 provide fractional amounts of the total range of phase shift, so that the phase shift resolution for a respective phase shift element is defined by the number N of resistors of the resistor ladder network as 360°/N.

An interconnect or crosspoint switch network 40 is coupled between each of the voltage outputs 31 of the multiple voltage supply unit 30 and voltage control inputs 23 of the plurality of voltage-controlled phase shift elements 20. The interconnect switch network 40 is configured to selectively couple any of the different voltages supplied by the multiple voltage supply unit 30 to the voltage control input 23 of any of the plurality of voltage-controlled phase shift elements 20.

For this purpose, the interconnect switch network 40 is shown as comprising a two-dimensional switch array, formed of parallel rows 41-1, 41-2, 41-3, 41-4, ..., 41-N of cascaded switches, each of which connected between a respective voltage output port 31-$i$ of the multiple voltage supply unit and one of a plurality of column output line 42-1, 42-2, 42-3, 42-4, ..., 42-M. The number of switches in a respective row 41-$i$ corresponds to the total number of phase shift elements 20-1, 20-2, 20-3, 20-4, ..., 20-M. The number of rows of the interconnect switch network 40 is defined in accordance with the resolution of the output voltage that is selectively applied to any given phase shift element. In the illustrated example, there are N rows of cascaded switches of M switches per row, to realize an N×M crosspoint interconnect switch capacity. The column links 42 of the interconnect switch network are coupled to the control voltage 23 inputs of respective ones of the phase shift elements. Via a control link 43, each switch element is adapted to be controllably closed by a supervisory controller, such as field programmable gate array, to create the phase shift pattern desired.

As noted above and as can be readily seen from the architecture of FIG. 1, through selective operation of its switches, the interconnect switch network 40 is able to selectively drive any phase shift element 20 of the array with any one of a plurality of prescribed phase shift-control voltages supplied by the resistor ladder network 30, so as to enable the phased array to realize any phase shift pattern.

It should be noted that this architecture allows the use of both linear and non-linear phase shift elements. In the former case, the resistor ladder network is configured of equal valued resistors, so as to provide equal amounts of control voltage at the voltage output ports 31-1, 31-2, 31-3, 31-4, ..., 31-N, from which respectively different phase shift control voltages are supplied. In the latter case, the resistor values of the resistor ladder network may be scaled to produce non-linear voltages that will produce the desired linear effect at the output of each phase shifter.

Figure 2:
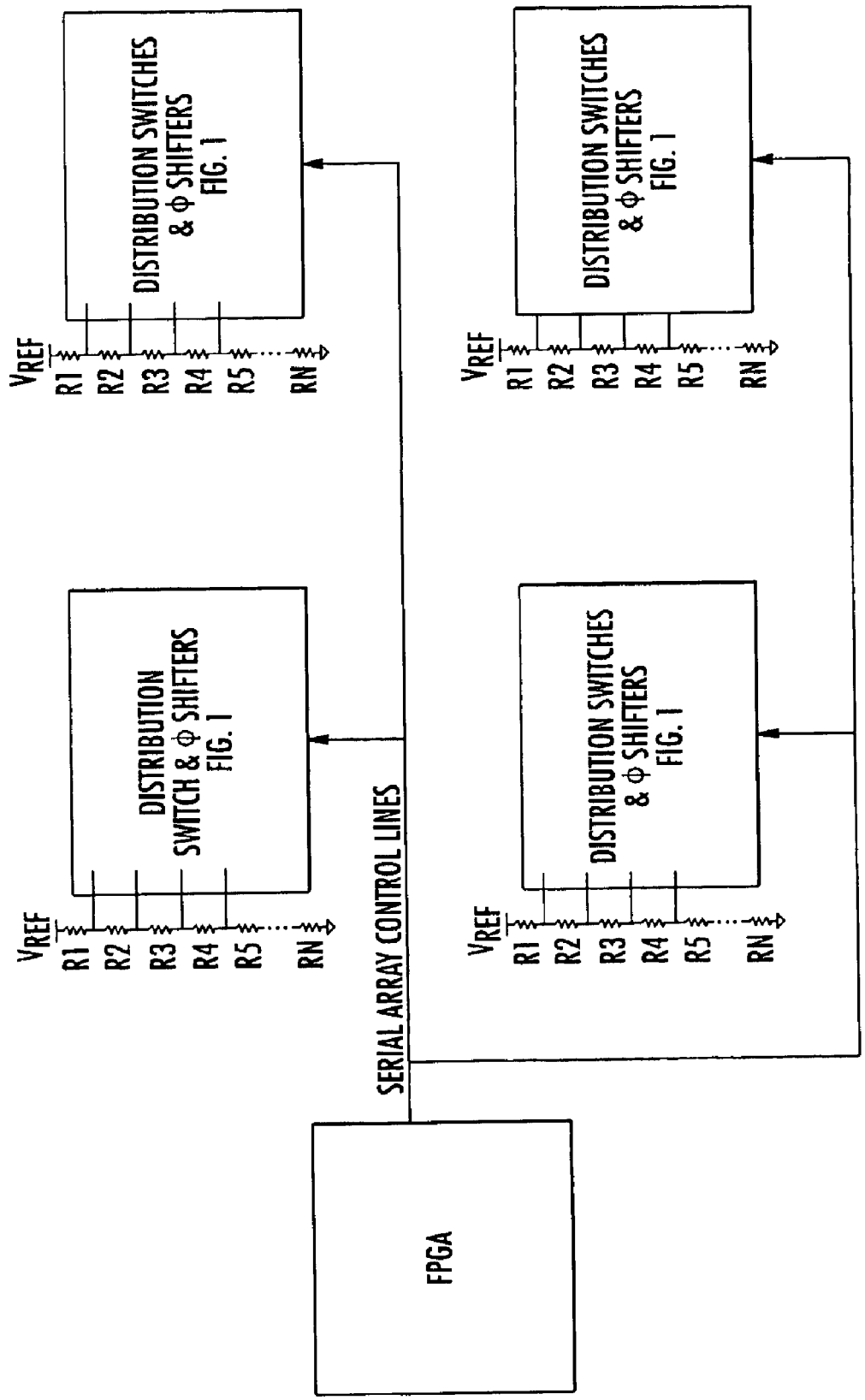
FIG. 2 diagrammatically illustrates an expansion of the phase array architecture of FIG. 1 to produce a multi-array architecture controlled by a single FPGA controller.

FIG. 2 diagrammatically illustrates an expansion of the phase shift network of FIG. 1 to produce a multi-array architecture controlled by a single FPGA controller. In the illustrated architecture, each interconnect switch network 40 is shown has being connected to its own dedicated resistor ladder. However, it should be noted that multiple switch networks may be driven by the same resistor ladder. If device loading is a concern voltage follower circuits may be coupled between the output ports of the resistor ladder and the inputs to the switch networks.

While we have shown and described an embodiment in accordance with the present invention, it is to be understood that the same is not limited thereto but is susceptible to numerous changes and modifications as known to a person skilled in the art. We therefore do not wish to be limited to the details shown and described herein, but intend to cover all such changes and modifications as are obvious to one of ordinary skill in the art.

What is claimed is:

1. A phase shift apparatus comprising:
    a plurality of voltage-controlled analog phase shift elements to which respective input signals are supplied and from which phase-shifted output signals, shifted in phase relative to said input signals in accordance with control voltages supplied to voltage control inputs thereof, are produced;
    a multiple voltage supply unit having a plurality of voltage outputs that supply respectively different voltages; and
    an interconnect switch network, coupled between said voltage outputs of said multiple voltage supply unit and said voltage control inputs of said plurality of voltage-controlled phase shift elements, and being operative to selectively couple any of said different voltages supplied by said multiple voltage supply unit to said voltage control inputs of any of said plurality of voltage-controlled phase shift elements.

2. The phase shift apparatus according to claim 1, wherein a respective analog phase shift element comprises a ferro-electric phase shift element.

3. The phase shift apparatus according to claim 1, wherein said multiple voltage supply unit comprises a resistor ladder network containing a plurality of resistors coupled between first and second voltage reference terminals and having common connections between respective resistors thereof coupled to said voltage outputs from which said respectively different voltages are supplied.

4. The phase shift apparatus according to claim 3, wherein said first and second voltage reference terminals provide a voltage differential therebetween that is effective to produce a prescribed amount of phase shift through a respective one of said voltage-controlled phase shift elements.

5. The phase shift apparatus according to claim 4, wherein said prescribed amount of phase shift corresponds to 360° of phase shift.

6. The phase shift apparatus according to claim 5, wherein the phase shift resolution for a respective one of said voltage controlled analog phase shift elements is defined by the number N of resistors of said resistor ladder network as 360°/N.

7. The phase shift apparatus according to claim 3, wherein said voltage-controlled phase shift elements include phase shift elements that are operative to produce phase shift outputs that are linearly proportional to the control voltages supplied to the voltage control inputs thereof.

8. The phase shift apparatus according to claim 7, wherein said respective resistors of said resistor ladder network are equal valued resistors.

9. The phase shift apparatus according to claim 3, wherein said voltage-controlled phase shift elements include phase shift elements that are operative to produce phase shift outputs that are non-linearly proportional to the control voltages supplied to the voltage control inputs thereof.

10. The phase shift apparatus according to claim 9, wherein said respective resistors of said resistor ladder network are unequal valued resistors.

11. A method of imparting controlled phase shifts to a plurality input signals so as to produce phase-shifted output signals, that are shifted in phase relative to said input signals, said method comprising the steps of:

(a) coupling said respective ones of said plurality of input signals to respective ones of a plurality of voltage-controlled analog phase shift elements, which are operative to impart prescribed amounts of phase shift to the input signals applied thereto in accordance with control voltages supplied to voltage control inputs thereof;

(b) providing a multiple voltage supply unit having a plurality of voltage outputs from which respectively different voltages are supplied;

(c) coupling an interconnect switch network between each of said voltage outputs of said multiple voltage supply unit and said voltage control inputs of said plurality of voltage-controlled phase shift elements, said interconnect switch network being capable of selectively coupling any of said different voltages supplied by said multiple voltage supply unit to said voltage control inputs of any of said plurality of voltage-controlled phase shift elements; and (d) controlling the operation of said interconnect switch network so as to couple selected ones of said different voltages supplied thereto by said multiple voltage supply unit to voltage control inputs of selected ones of said plurality of voltage-controlled phase shift elements.

12. The method according to claim 11, wherein said multiple voltage supply unit comprises a resistor ladder network containing a plurality of resistors coupled between first and second voltage reference terminals and having common connections between respective resistors thereof coupled to said voltage outputs from which said respectively different voltages are supplied.

13. The method according to claim 12, wherein said first and second voltage reference terminals provide a voltage differential therebetween that is effective to produce a prescribed amount of phase shift through a respective one of said voltage-controlled phase shift elements.

14. The method according to claim 13, wherein said prescribed amount of phase shift corresponds to 360° of phase shift.

15. The method according to claim 14, wherein the phase shift resolution for a respective one of said phase shift elements is defined by the number N of resistors of said resistor ladder network as 360°/N.

16. The method according to claim 12, wherein said voltage-controlled phase shift elements include phase shift elements that are operative to produce phase shift outputs that are linearly proportional to the control voltages supplied to the voltage control inputs thereof.

17. The method according to claim 16, wherein said respective resistors of said resistor ladder network are equal valued resistors.

18. The method according to claim 12, wherein said voltage-controlled phase shift elements include phase shift elements that are operative to produce phase shift outputs that are non-linearly proportional to the control voltages supplied to the voltage control inputs thereof.

19. The method according to claim 18, wherein said respective resistors of said resistor ladder network are unequal valued resistors.

20. The method according to claim 11, wherein a respective analog phase shift element comprises a ferro-electric phase shift element.

* * * * *